(12) United States Patent
Anderson et al.

(10) Patent No.: US 11,898,899 B2
(45) Date of Patent: Feb. 13, 2024

(54) MICRO-OPTO-MECHANICAL SYSTEM SENSOR, ARRANGEMENT AND MANUFACTURING METHOD

(71) Applicant: MIRAEX SA, Lausanne (CH)

(72) Inventors: Mitchell Anderson, Pully (CH); Clément Javerzac-Galy, Lausanne (CH); Olexiy Feofanov, Epalinges (CH); Nicolas Abelé, Lausanne (CH)

(73) Assignee: MIRAEX SA, Lausanne (CH)

( * ) Notice: Subject to any disclaimer, the term of this patent is extended or adjusted under 35 U.S.C. 154(b) by 409 days.

(21) Appl. No.: 17/175,403

(22) Filed: Feb. 12, 2021

(65) Prior Publication Data

US 2021/0255031 A1 Aug. 19, 2021

(30) Foreign Application Priority Data

Feb. 13, 2020 (EP) ..................... 20157050

(51) Int. Cl.
*G01H 9/00* (2006.01)
*B81B 3/00* (2006.01)
(Continued)

(52) U.S. Cl.
CPC ........... *G01H 9/004* (2013.01); *B81B 3/0027* (2013.01); *B81B 7/0038* (2013.01); *B81B 7/02* (2013.01);
(Continued)

(58) Field of Classification Search
CPC ... B81B 3/0027; B81B 3/0054; B81B 7/0038; B81B 7/02; B81B 7/0067;
(Continued)

(56) References Cited

U.S. PATENT DOCUMENTS 5,654,819 A 8/1997 Goossen et al.
6,522,801 B1 * 2/2003 Aksyuk ............... B81C 1/00666
385/16
(Continued)

FOREIGN PATENT DOCUMENTS

CA 2590402 A1 11/2008
CN 106841680 B 11/2019
WO 2017089235 A 6/2017

OTHER PUBLICATIONS

Extended European Search Report in EP Application No. 20157050.4 dated Aug. 21, 2020.

*Primary Examiner* — Andrew Jordan
(74) *Attorney, Agent, or Firm* — Maschoff Brennan

(57) ABSTRACT

There is provided a MOMS sensor comprising a fiber interface comprising a fiber passthrough for one or more optical fibers, a cavity comprising an element hermetically encapsulated within the cavity, wherein the element is movably anchored by SiN arms, which are movable with respect to walls of the cavity, wherein the SiN arms comprise anchor portions at first ends of the SiN arms, which are connected to the element, and at second ends of the SiN arms, which are connected to the walls of the cavity, and the fiber interface is configured to receive the fibers through the fiber passthrough into positions for communications of light between the element and the fibers. In this way a robust structure that supports sensitivity of the sensor is provided.

13 Claims, 9 Drawing Sheets

(51) Int. Cl.
   *B81B 7/00* (2006.01)
   *B81B 7/02* (2006.01)
   *B81C 3/00* (2006.01)
   *G02B 6/26* (2006.01)
   *G01L 9/00* (2006.01)
   *G01L 1/24* (2006.01)

(52) U.S. Cl.
   CPC ............... *B81C 3/001* (2013.01); *G01L 1/24* (2013.01); *G01L 9/0017* (2013.01); *G02B 6/262* (2013.01); *B81B 2201/047* (2013.01); *B81B 2203/0127* (2013.01); *B81B 2203/0307* (2013.01)

(58) Field of Classification Search
   CPC ...... B81B 2201/047; B81B 2201/0235; B81B 2201/0257; B81B 2201/0264; B81B 2201/042; B81B 2203/0127; B81B 2203/0307; B81B 2203/0163; B81B 2203/053; B81B 2203/055; B81C 3/001; G01L 1/24; G01L 9/0017; G02B 6/262; G02B 6/4204; G02B 6/4248; G01P 15/093; G01P 15/18; H04R 23/008; G01H 9/004
   See application file for complete search history.

(56) References Cited

U.S. PATENT DOCUMENTS

| | | | |
|---|---|---|---|
| 6,559,464 B1* | 5/2003 | Flanders | G02B 6/4201 250/548 |
| 6,577,793 B2* | 6/2003 | Vaganov | H04Q 11/0005 385/32 |
| 7,518,731 B2* | 4/2009 | Li | G01P 15/093 356/482 |
| 7,533,822 B2* | 5/2009 | Oliva | G06K 7/10603 235/462.36 |
| 2004/0046111 A1 | 3/2004 | Swierkowski | |
| 2006/0192974 A1* | 8/2006 | Li | G01D 5/268 73/514.27 |
| 2010/0193781 A1* | 8/2010 | Tripathy | B81C 1/00484 438/479 |
| 2011/0268384 A1 | 11/2011 | Akkaya et al. | |
| 2011/0274386 A1 | 11/2011 | Bosselmann et al. | |
| 2017/0307437 A1 | 10/2017 | Staehle-Bouliane et al. | |
| 2019/0202686 A1* | 7/2019 | Tseng | H01S 5/02257 |
| 2021/0255031 A1* | 8/2021 | Anderson | H04R 23/008 |

\* cited by examiner

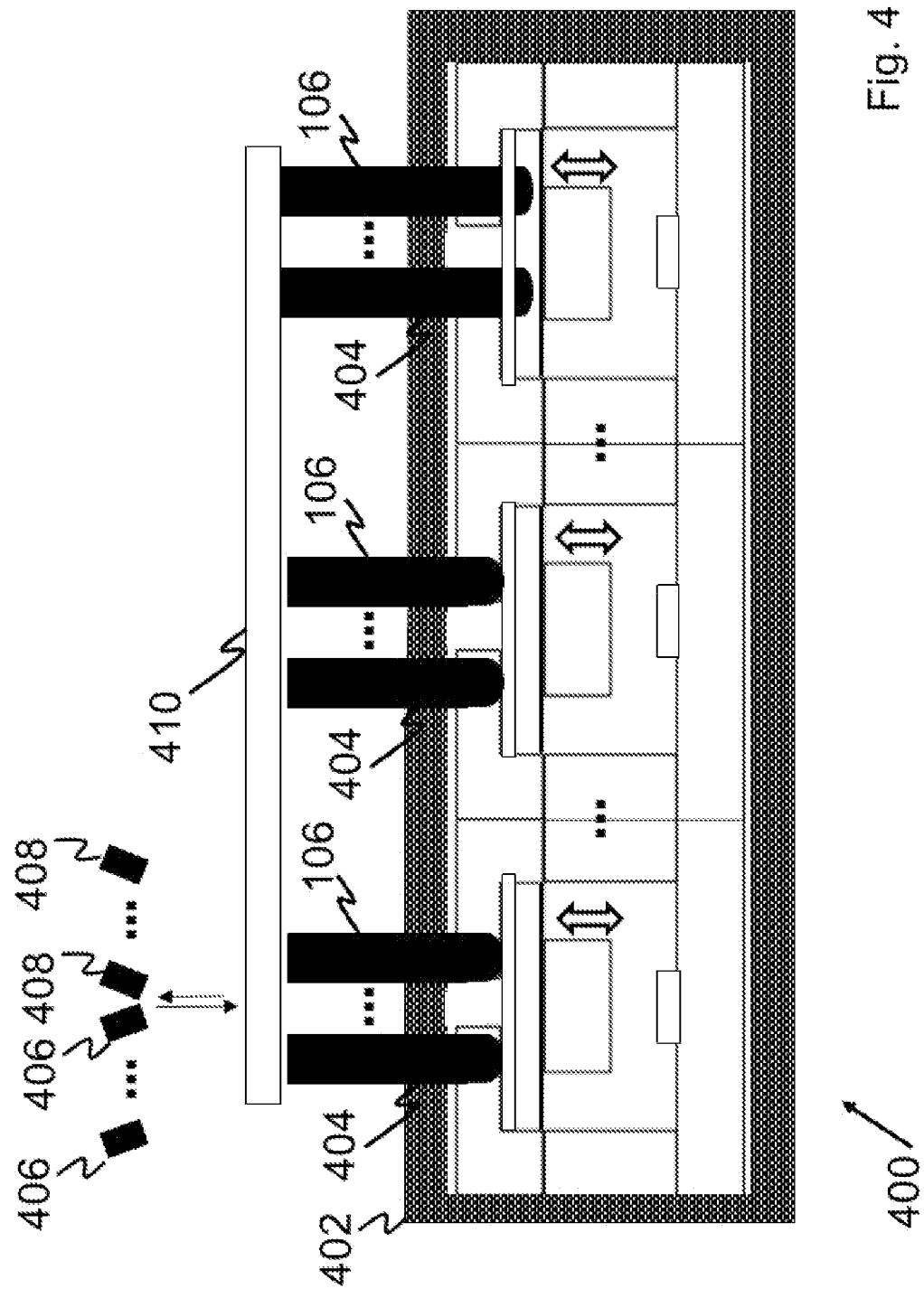

Shapes of SiN arms

MICRO-OPTO-MECHANICAL SYSTEM SENSOR, ARRANGEMENT AND MANUFACTURING METHOD

TECHNICAL FIELD

The present invention relates to micro-opto-mechanical system (MOMS) sensors.

BACKGROUND

This section is intended to provide a background or context to the invention that is recited in the claims. The description herein may include concepts that could be pursued but are not necessarily ones that have been previously conceived or pursued. Therefore, unless otherwise indicated herein, what is described in this section is not prior art to the description and claims in this application and is not admitted to be prior art by inclusion in this section.

A micro-opto-mechanical system (MOMS) sensor converts mechanical movement of a membrane, on micrometer scale, into an optical signal. Sensitivity of the MOMS sensor can suffer if the movement of the membrane is damped. In order to have a high sensitivity, large displacement of the membrane should be supported. However, supporting the large displacement of the membrane reduces the sensitivity of the MOMS sensor at small energy levels. Moreover, the larger the displacement is, the greater the forces acting on the membrane are, whereby breakage of the MOMS sensor may follow.

SUMMARY

The scope of protection sought for various embodiments of the invention is set out by the independent claims. The embodiments, examples and features, if any, described in this specification that do not fall under the scope of the independent claims are to be interpreted as examples useful for understanding various embodiments of the invention.

According to a first aspect there is provided a micro-opto-mechanical system (MOMS) sensor according to claim 1.

According to a second aspect there is provided an arrangement according to claim 9.

According to a third aspect there is provided a method for manufacturing one or more MOMS sensors as recited in claim 13.

BRIEF DESCRIPTION OF THE DRAWINGS

For a more complete understanding of example embodiments of the present invention, reference is now made to the following descriptions taken in connection with the accompanying drawings in which:

FIG. 4 illustrates an example arrangement comprising more than one MOMS sensor in accordance with at least some embodiments of the present invention;

DETAILED DESCRIPTION OF SOME EXAMPLE EMBODIMENTS

Figure 1A:
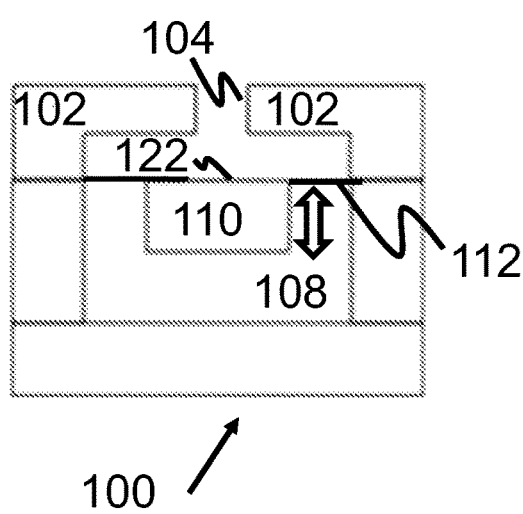
FIGS. 1*a* and 1*b* illustrate examples of a micro-opto-mechanical system (MOMS) sensor and an arrangement in accordance with at least some embodiments of the present invention.

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. The same or similar features in the drawings are referenced by using the same reference numerals.

There is provided a MOMS sensor comprising a fiber interface comprising a fiber passthrough for one or more optical fibers, a cavity comprising an element hermetically encapsulated within the cavity, wherein the element is movably anchored by SiN arms, which are movable with respect to walls of the cavity, wherein the SiN arms comprise anchor portions at first ends of the SiN arms, which are connected to the element, and at second ends of the SiN arms, which are connected to the walls of the cavity, and the fiber interface is configured to receive the fibers through the fiber passthrough into positions for communications of light between the element and the fibers. In this way a robust structure that supports sensitivity of the sensor is provided.

In the following examples, encapsulation provides controlling atmosphere within which the element is moving and through which light is communicated. The atmosphere may be controlled in terms to at least one of humidity, temperature, and number of particles.

In the following SiN, Si(x)N(y) or silicon nitride refers to a group of chemical compounds of silicon and nitrogen comprising at least $Si_3N_4$: $\alpha$-$Si_3N_4$, $\beta$-$Si_3N_4$, $\gamma$-$Si_3N_4$. From these $\alpha$-$Si_3N_4$ may be preferred for hardness. On the other hand, $\beta$-$Si_3N_4$ is chemically the most stable of them. Accordingly, the proportions of Si and N may be the same or different in the group of chemical compounds.

A MOMS sensor is manufactured from parts that are based on semiconductor and/or insulator wafers bonded together. An example of a semiconductor wafer is a silicon (Si) wafer. An example of an insulator wafer is a glass wafer. Therefore, in the following, a fiber interface part of the MOMS sensor may be referred to as a fiber wafer or a wafer comprising fiber passthroughs. The cavity walls, the element and the SiN arms of the MOMS sensor may be collectively referred to as a sensor wafer. A cap wafer of the MOMS sensor may refer to a wafer serving for enclosing the element into the cavity. The cap wafer may also be referred to a bottom cap, whereby the fiber interface may be referred to a top cap. Accordingly, a side of the MOMS sensor comprising the top cap may be referred to a topside of an Si wafer in the MOMS sensor and a side of the MOMS sensor comprising the bottom cap may be referred to a backside of an Si wafer in the MOMS sensor. At least in some embodiments the top cap and the bottom cap may serve for encapsulating the element inside a cavity. The MOMS sensor may be manufactured by a micrometer-scale manufacturing process or a nanometer scale manufacturing process, whereby the accuracy of the dimensions may be measured in micrometer or nanometer scale.

Figure 1B:
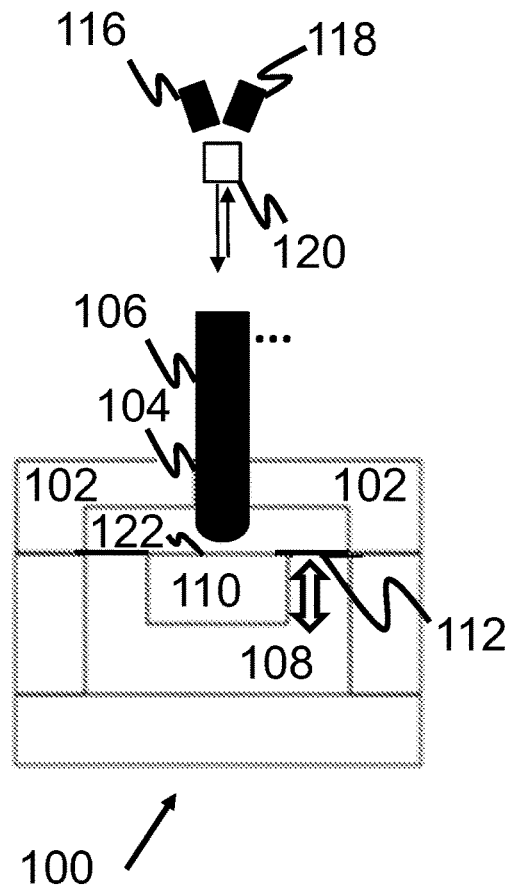

FIGS. 1a and 1b illustrate in cross-sectional views examples of a MOMS sensor and an arrangement in accordance with at least some embodiments of the present invention. The MOMS sensor 100 comprises a fiber interface 102 comprising a fiber passthrough, aperture, opening or passage 104 for one or more optical fibers 106, a cavity 108 comprising an element 110 hermetically encapsulated within the cavity, wherein the element is movably anchored by SiN arms 112 to the walls of the cavity, and the fiber interface is configured to receive the fibers through the fiber passthrough into positions for communications of light between the element and the fibers. In the present example, the element is anchored by two arms 112 although any other number or arms would equally be possible. Advantageously the number of arms is at least two but it can be higher, for example two, three, four or more. Furthermore, the arms are connected to the element 110 at its opposing sides or ends. The arms are in this example flexible longitudinal elements.

Use of the SiN arms may bring many benefits to the MOMS sensors when compared to solutions where Si arms are used. The benefits may comprise one or more of the following: a larger frequency bandwidth, a higher motion linearity, an improved shock resistance and a higher sensitivity of the MOMS sensor.

It should be appreciated that when fibers are received at the positions for communications of light between the element 110 and the fibers 106, the fibers are connected to the MOMS sensor, and the element may be interrogated or stimulated by light beams from the fibers directed at a surface of the element and reflected back to the fibers. Accordingly, interrogating the element comprises transmitting light through the one or more fibers to the element and measuring intensities of the transmitted light reflected back from the element to the fibers.

The arrangement comprises one or more light sources 116 and one or more light detectors 118 that are connected by the one or more optical fibers 106 to the MOMS sensor 100. An optical mixer device 120 may be used for coupling of light between light sources, light detectors and fibers, whereby implementations of the arrangement for different numbers of light sources, light detectors and optical fibers may be supported.

In an example according to at least some embodiments, the fiber interface 102 is a part of the cavity. In this way at least part of the walls of the cavity are formed by the fiber interface. When fibers are received in all fiber passthroughs 104 of the fiber interface, the element 110 may be hermetically encapsulated within the cavity comprising the fiber interface. Optical fibers received in the fiber passthrough are brought directly within the cavity, whereby light between the optical fibers and the element travels within the atmosphere enclosed within the cavity. In this way the interrogation of the element may be made within the encapsulated cavity. Thus, in this example, the one or more optical fibers are sealingly placed across the passthrough so that the fibers cross the passthrough along their longitudinal axis.

In an example according to at least some embodiments, the SiN arms 112 comprise anchor elements or portions at the ends of the SiN arms, which are connected to the element and at the opposing ends of the SiN arms, which are connected to the walls of the cavity. The SiN arms with anchor portions provide a robust while sensitive suspension of the element inside the cavity. The shapes of the SiN arms between its ends may be configured sensitive to movement of the element in one or more directions of movement, while the anchor portions provide robust attachments for securely suspending the element by the anchor portions. The element may also of SiN.

In an example in accordance with at least some embodiments, a reflective surface is arranged at an end of at least one fiber 106 connected to a MOMS sensor 100 or a reflective surface is arranged on a transparent layer between the element 110 and at least one fiber 106, or reflective surfaces are arranged both at an end of at least one fiber 106 and a reflective surface is arranged on a transparent layer between the element 110 and at least one fiber 106. In this way fiber perturbations may be determined on the basis of a measured intensity of light reflected back from the reflective surface of the fiber 106 and/or of the transparent layer. In an example, the fiber perturbations may be compensated in light intensity measurements made using the one or more other fibers that may interrogate the element inside the cavity. In an example, the tip of the fiber may be flat, rounded or conical. In an example, the reflective surface may be a Fiber Bragg Grating (FBG) or semi-reflective coating on the fiber. Alternatively, a FBG may be included in the fiber before the tip, to be used as wavelength selective reflector to reflect a given wavelength to the light sensor, hence enabling to deduce from the measured light signal from the MOMS, any light variation from the fiber itself. In that case the light bounced back by the FBG will act as a reference, and can be deducted from the light bounced back from the MOMS device into the same fiber, or a fiber next to it. The reflective surface may be arranged to the transparent layer by a coating for example.

In an example in accordance with at least some embodiments, the element 110 comprises at least one surface 122 that is capable of reflecting light, i.e. it forms another reflective surface. The at least one surface may be aligned for receiving light from the fibers connected to the fiber passthroughs. More specifically, this surface is in this example arranged orthogonally or substantially orthogonally with respect to the longitudinal axis of the fibers. The element may comprise a mass that may be adapted for attachment of one or more additional masses, for adapting sensitivity of the MOMS sensor. The mass may be of Si.

In an example in accordance with at least some embodiments, the element 110 may be a membrane. The membrane may be movable by movement, such as vibration of the MOMS sensor, by atmospheric pressure changes, by acoustical waves, or by electric fields. The thickness of the membrane may be in the order of 200 nm, and can be as thin as 10 nm and beyond 2 µm. The thickness of the total mass, SiN layer plus silicon underneath, would be from 1 µm to 750 µm, and in most cases from 5 µm to 300 µm.

In an example in accordance with at least some embodiments, the element 110 comprises a transparent membrane or at least a semi-transparent membrane, and a mass is attached under the membrane. In other words, the mass is in this example attached to a surface which faces away from the fibers and which is located opposite to the surface which faces the fibers. In this way the light from the fibers passes through the membrane to a surface of the element, which faces away from the fibers. The transparency of the membrane may be dependent on the wavelength of the light.

Figure 2A:
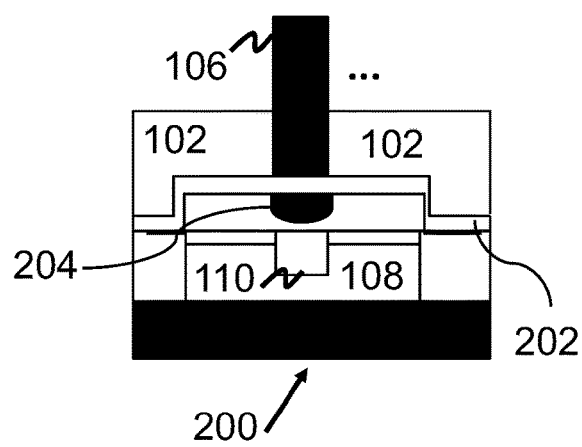
FIGS. 2*a* and 2*b* illustrate examples of a micro-opto-mechanical system (MOMS) sensor and an arrangement for an improved focus of light beams and encapsulation in accordance with at least some embodiments of the present invention.
Figure 2B:
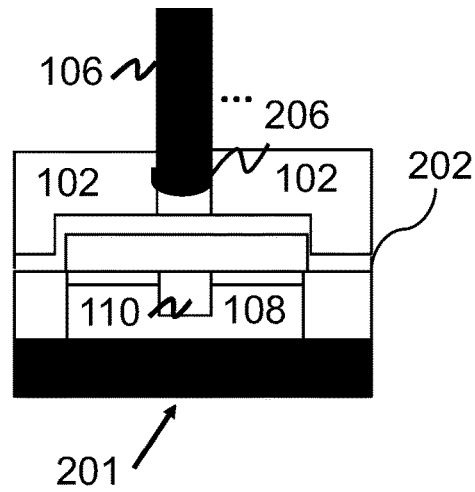

FIGS. 2a and 2b illustrate examples of MOMS sensors for an improved focus of light beams and encapsulation in accordance with at least some embodiments of the present invention. The MOMS sensors 200, 201 may be in accordance with the MOMS sensor described in connection with FIGS. 1a and 1b. As a difference to the MOMS sensor described in connection with FIGS. 1a and 1b, in FIGS. 2a and 2b the fiber interface 102 is separated from the cavity by a transparent layer 202 for communications of light between the element 110 and the fibers 106 received through the fiber passthrough. In this way, the transparent layer is arranged between the optical fibers 106 and the element 110 within the cavity 108 even if optical fibers have not been received into the fiber passthrough, and improved control of the atmosphere inside the cavity 108 may be provided. Examples of the transparent layer comprise at least glass and a polymer such as parylene. As shown in FIGS. 2a and 2b, in this example, the fibers do not extend into the cavity and may longitudinally occupy only a portion of the passthrough.

In an example in accordance with at least some embodiments, the transparent layer 202 comprises one or more lenses 204 for communications of light between the fibers 106 received through the fiber passthrough. In this way light beams from the optical fibers received in the fiber passthrough may be more or less focused onto a surface of the element or onto a specific point on the surface. It should be appreciated that preferably the lenses and the transparent layer form an optically uniform structure in terms of the refraction index. Accordingly, the refraction indices of the lenses and the transparent layer are preferably the same and there are no gaps between the lenses and the transparent layer. In this way parasitic light reflections due to change of the refraction index may be avoided or mitigated. The refraction index may be of a material, air or gas that the light travels through.

In an example in accordance with at least some embodiments, the MOMS sensor 200 comprises one or more lenses 204 arranged at a side of the transparent layer 202 inside the cavity. In this way the lenses may be protected from the environment of the MOMS sensor.

In an example in accordance with at least some embodiments, the MOMS sensor 201 comprises one or more lenses 206 arranged at ends of the optical fibers, i.e. at the tips of the fibers or at the fiber tips, received within the fiber passthroughs 104. Each optical fiber may have its own lens.

In an example, the lenses may be arranged to the ends of the optical fibers by etching. In another example, the lenses may be arranged to the ends of the optical fibers by soldering or gluing the lenses to the fiber tips.

It should be appreciated that glass- or polymer-based lenses may be manufactured by injection molding and attached to fibers tips by gluing or soldering. Flat lenses may be preferred for accurate positioning into the fiber interface. On the other hand a flat fiber tip may be tightly positioned at the transparent layer and a lens may be arranged on the side of the transparent layer towards the inside of the cavity.

In an example in accordance with at least some embodiments, the one or more lenses 204 are configured to offset focal spots of light beams of the fibers 106 to the element 110. In an example, the focal spots are offset to a surface of the element. Offsetting the focal spots may be particularly interesting for using the MOMS sensor for more than one frequency bandwidth. For example the element inside the cavity may have various modes of vibration at various frequencies. One mode may be the mode where the membrane moves up and down and where the peak deflection is at the center of the element. However, other mechanical modes of vibration may exist at different frequencies and with different localization of the peak deflection on the surface of the element. Advantageously by only changing the lens-tipped-fiber, the focal spot may be changed from a maximum deflection point of one mode to a maximum deflection point of another mode.

In an example in accordance with at least some embodiments, the transparent layer 202 is of a semi-transparent getter material or an alloy of glass and getter. In this way the transparent layer may serve at least for encapsulation of the element, interrogating the element and as getter for controlling the atmosphere inside the cavity. The transparent layer serving as the getter provides that the atmosphere inside the cavity may be brought to a desired state in terms of a pressure and/or gas content, for example a vacuum.

Figure 3A:
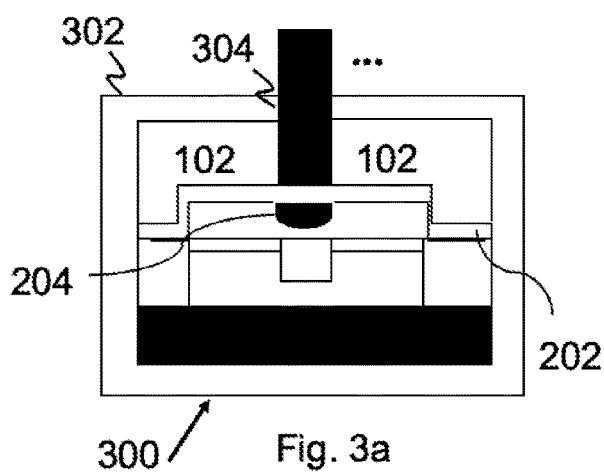
FIGS. 3*a* and 3*b* illustrate examples of a micro-opto-mechanical system (MOMS) sensor and an arrangement for an improved sensitivity and encapsulation in accordance with at least some embodiments of the present invention.
Figure 3B:
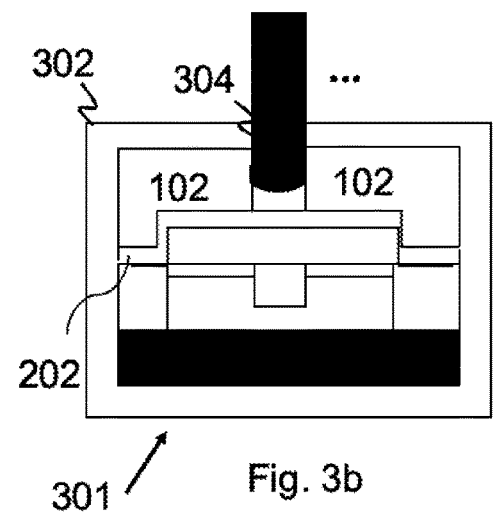

FIGS. 3a and 3b illustrate examples of MOMS sensors for an improved sensitivity in accordance with at least some embodiments of the present invention. The MOMS sensors may be in accordance with the description provided in connection with FIGS. 2a and 2b. The MOMS sensor 300 may be in accordance with the MOMS sensor 200 described in connection with FIG. 2a and the MOMS sensor 301 may be accordance with the MOMS sensor 201 described in connection with FIG. 2b. As a difference to FIGS. 2a and 2b, the MOMS sensors 300, 301 comprise a hermetically encapsulating ceramic outer shell 302. The ceramic outer shell supports heat distribution around the MOMS sensor, mitigating thermal stresses in the in the MOMS sensor and mitigating thermal expansions in the MOMS sensor, whereby sensitivity of the MOMS sensor may be supported over a desired temperature range while keeping measurement shift acceptable. In an example, the ceramic outer shell may be Alumina. The hermetically encapsulating outer shell comprises fiber passthroughs 304 for the fiber interface 102 of the MOMS sensor.

FIG. 4 illustrates an example of an arrangement comprising more than one MOMS sensor in accordance with at least some embodiments of the present invention. The arrangement 400 comprises MOMS sensors enclosed within a hermetically encapsulating ceramic outer shell 402. The MOMS sensors may be in accordance with one or more of the examples described in connection with FIGS. 1a, 1b, 2a and 2b. The ceramic outer shell may be made of Alumina (AlOx). The ceramic outer shell comprises fiber passthroughs 404 for fiber interfaces of the MOMS sensors inside the ceramic outer shell, whereby the fibers may be received at the fiber passthroughs of the fiber interfaces. The arrangement 400 comprises one or more light sources 406 and one or more light detectors 408 that are connected by the one or more optical fibers 106 to the MOMS sensors. One or more optical mixer devices 410 may be used for connecting or coupling of light between the light sources, light detectors and fibers of the MOMS sensors, whereby implementations of the arrangement for different numbers of light sources, light detectors, optical fibers and MOMS sensors may be supported.

In accordance with at least some embodiments, at least a part of the optical fibers 106 of the arrangement 400 comprises a lens at the end of the fiber connected to a MOMS sensor. It should be appreciated that it is viable that all the fibers have a lens at the end of the fiber connected to a MOMS sensor. The lens may be configured to offset a focal spot of a light beam of the fiber to the element.

Figure 5:
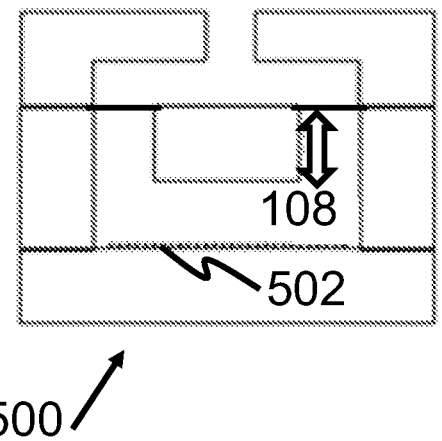
FIG. 5 illustrates an example of controlling atmosphere inside a micro-opto-mechanical system (MOMS) sensor in accordance with at least some embodiments of the present invention.

FIG. 5 illustrates an example of controlling atmosphere inside a MOMS sensor in accordance with at least some embodiments of the present invention. The MOMS sensor 500 may be in accordance with one or more of the examples described in connection with FIGS. 1a, 1b, 2a and 2b. The cavity 108 of the MOMS sensor comprises a getter for controlling atmosphere inside the cavity. In this way sensitivity of the MOMS sensor is supported. The getter provides that the atmosphere inside the cavity may be brought to a desired state in terms of a pressure and/or gas content, for example a vacuum.

In an example, the getter 502 is made of non-evaporable material configured to absorb or adsorb residual gases or particles within the cavity, in response to heating the getter above an activation temperature. The getter material also supports manufacturing the MOMS sensor and arrangement of MOMS sensor, since the atmosphere inside the cavity may be brought to a desired state after assembly of the MOMS sensor or the arrangement by activation of the getter by heat. It should be appreciated that the getter may be deposited on any surface inside the cavity of the MOMS sensor and an arrangement of MOMS sensor may comprise MOMS sensors with or without the getter.

Figure 6A:
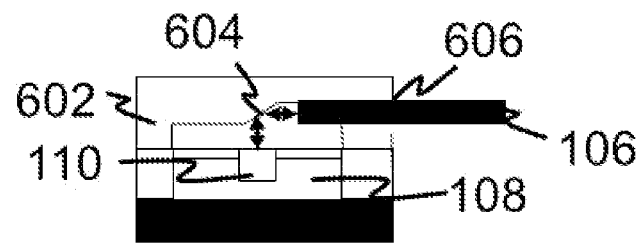
FIGS. 6*a* and 6*b* illustrate an example fiber interface supporting misalignment of a light beam received from an optical fiber.
Figure 6B:
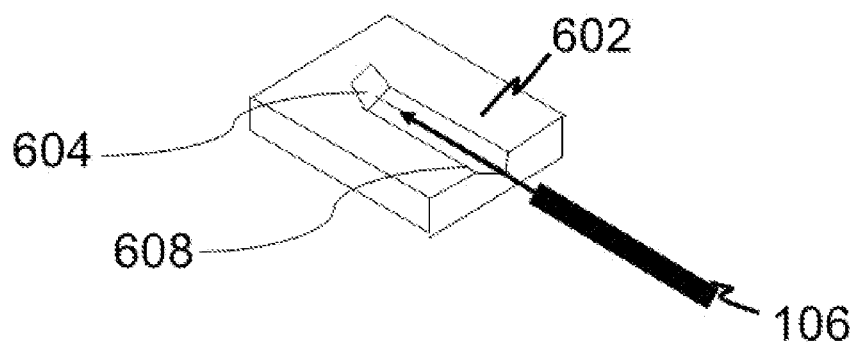

FIGS. 6a and 6b illustrate an example of a fiber interface supporting misalignment of a light beam received from an optical fiber. FIG. 6a illustrates a MOMS sensor 600 comprising the fiber interface 602 and FIG. 6b is a perspective view showing the fiber interface 602 of FIG. 6a upside down. The MOMS sensor 600 may be in accordance with one or more of the examples described in connection with FIGS. 1a, 1b, 2a and 2b but with the difference of the fiber interface 602. The fiber interface 602 comprises one or more reflective surfaces 604 for aligning light beams passing through the fibers 106 received through a fiber passthrough 606 for communications of light between the element 110 and the fibers. In this way the fiber passthrough on the fiber interface, or more specifically its entry point on the outer surface of the MOMS sensor, does not necessarily have a direct line of sight to the element 110 inside the cavity 108. In other words, an imaginary extension of a longitudinal or central axis of the passthrough does not coincide with the element (as is the case in the sensor depicted e.g. in FIGS. 1a and 1b). In an example, the fiber passthrough may be provided on a lateral side surface of the fiber interface. The lateral side surface may be angled, for example so that it is substantially perpendicular with respect to a surface of the element which is interrogated by light from the optical fibers. Therefore, light beams received from the optical fibers connected to the fiber passthrough are misaligned with respect to the light receiving surface of the element. Since the fiber interface comprises the reflective surfaces, the light beams from the optical fibers may be directed from the fibers to the surface of the element and reflected back from the element to the fibers.

In an example in accordance with at least some embodiments, the fiber interface may comprise a guiding groove 608 for the fiber received within the fiber passthrough. The guiding groove comprises one or more reflective surfaces 604 in this example at the end of the groove facing the light receiving surface of the element, whereby the guiding groove supports inserting the fibers 106 into the fiber passthrough 606 guided by the groove such that light beams from the fibers may be aligned by the reflective surfaces 604 for communications of light between the element 110 and the fibers 106.

Figure 7:
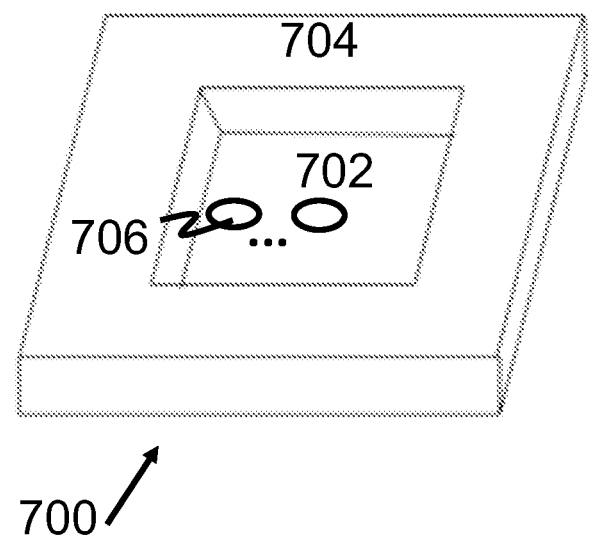
FIG. 7 illustrates an example fiber interface in accordance with at least some embodiments of the present invention.

FIG. 7 illustrates an example of a fiber interface in accordance with at least some embodiments of the present invention. The fiber interface 700 may be of an Si wafer comprising a cavity 702 surrounded by an edge 704 and one or more fiber passthroughs 706. The fiber interface may be a fiber interface described in connection with the MOMS sensors described with FIGS. 1a, 1b, 2a, 2b, 3a and 3b. During manufacturing of the MOMS sensors, the edge 704 may be bonded directly to a sensor wafer, or a transparent layer may be arranged between the edge surface and the sensor wafer. At least in some embodiments, the fiber interface forms at least a portion of the walls of the cavity of a MOMS sensor.

Figure 8:
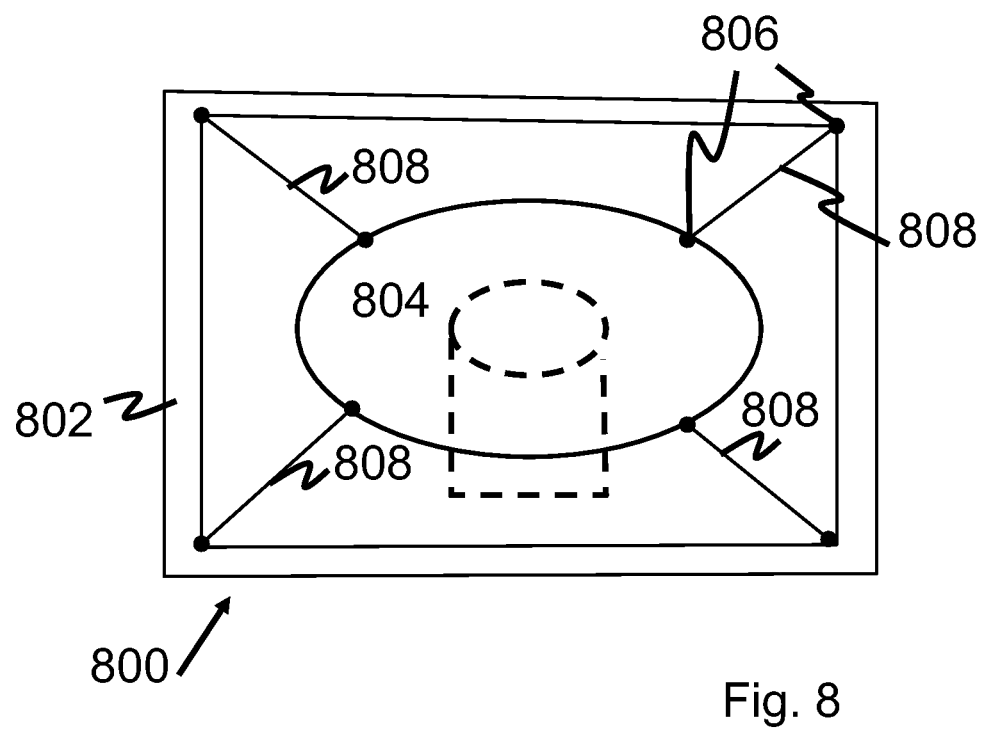
FIG. 8 illustrates an example sensor wafer in accordance with at least some embodiments of the present invention.

FIG. 8 illustrates an example of a sensor wafer in accordance with at least some embodiments of the present invention. The sensor wafer 800 may be an Si wafer comprising an edge 802, an element 804 and SiN arms 808 (in this case four of them) attached by anchor portions 806 of the SiN arms to the edge and the element. The edge forms at least a portion of the walls of the cavity of a MOMS sensor. The element is movably attached to the edge by the SiN arms. The element may be also of SiN or a combination of SiN and silicon.

Figure 9:
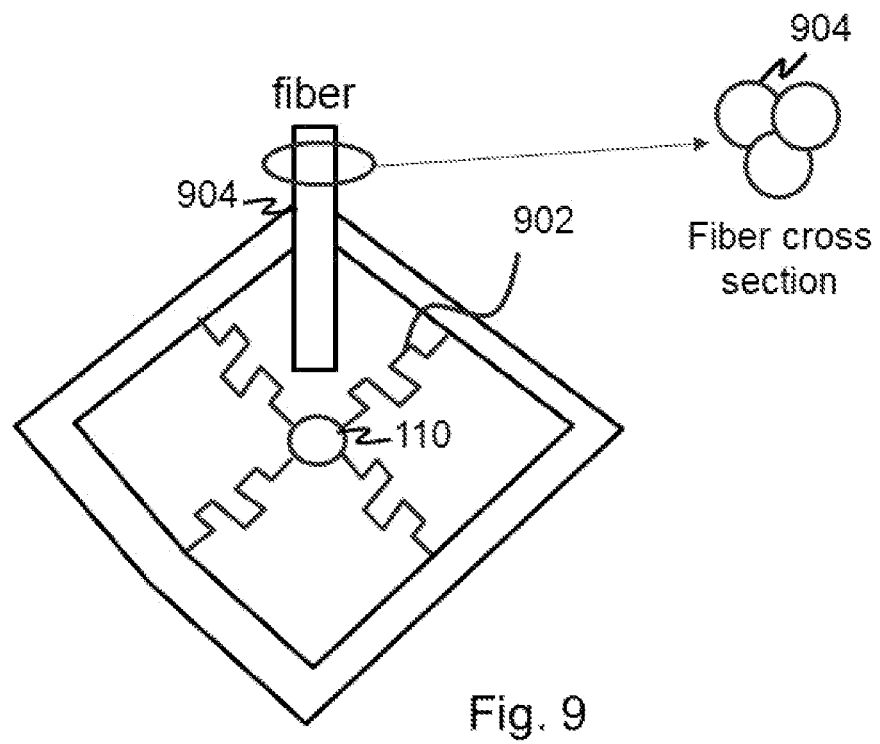
FIG. 9 illustrates an example structure of a MOMS sensor for measuring movement along more than one axis, in accordance with at least some embodiments of the present invention.

FIG. 9 illustrates an example structure of a MOMS sensor for measuring movement along more than one axis, in accordance with at least some embodiments of the present invention. The MOMS sensor may be in accordance with the MOMS sensors described with FIGS. 1a, 1b, 2a, 2b, 3a and 3b. However, as a difference, the MOMS sensor comprises SiN arms 902 that are configured sensitive to forces or are configured to sustain forces in one or more directions of movement. In this way the sensitivity of the element attached to the SiN arms may be improved with respect to the directions of the forces, and a force in any of the directions of the forces may generate a sufficient mechanical movement of the element 110 of the MOMS sensor that may be measured. Interrogation of the MOMS sensor for measuring movement in more than one axis may be performed using a bundle of fibers 904 (which are parallel to each other in this case) received in the fiber passthrough. The bundle of fibers may comprise for example three fibers that are in a bundle without spaces between the fibers such that hermetic packaging of the MOMS sensor may be supported. Each of the fibers may be used for measuring one axis of movement, whereby each axis may be measured by its own dedicated fiber. Lenses may be arranged at tips of the fibers for directing light beams from the fibers substantially to a center of the surface of the element. Alternatively or additionally, each of the lenses may be configured to focus light to a desired depth in the element that is sensitive to a specific axis of movement. In this way movement in directions of different axes may be measured by dedicated fibers with lensed tips configured to focus light to the depths, where the element is sensitive to the movement in the direction of each of the axes.

Figure 10:
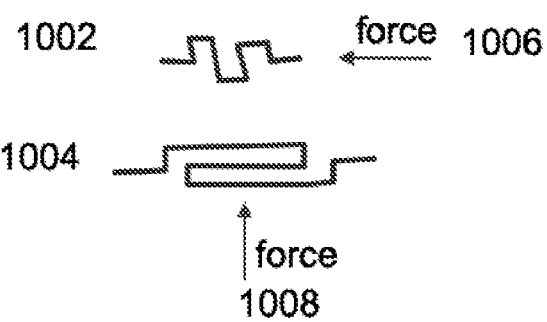
FIG. 10 illustrates example shapes for SiN arms, in accordance with at least some embodiments of the present invention.

FIG. 10 illustrates examples of shapes for SiN arms, in accordance with at least some embodiments of the present invention. Different shapes of the SiN arms provide configuring the SiN arms sensitive to forces in one or more directions of movement. In this way the SiN arms may support measuring movement in more than one direction by a MOMS sensor. The shapes 1002, 1004 of the SiN arms may be configured to be sensitive to forces applied to the MOMS sensor from different directions 1006, 1008. For example, the shape 1002 comprises steps arranged one after the other. Thus, the arms may comprise arm sections so that at least some of the arm portions are arranged orthogonally with respect to each other. The forces may be lateral forces. In an example, the shapes provide that the SiN arms are effectively springs. FIG. 10 illustrates two shapes for portions of the SiN arms between anchor points of the SiN arms. Each of the shapes may be sensitive to at least one direction of force. When an element of a MOMS sensors is suspended by the SiN arms inside the cavity and the element is subjected to a force, provided the SiN arms are configured sensitive to a direction of the force, the force is transformed to a movement of the element by the SiN arms. A shape of the SiN arms may provide that the SiN arms are particularly sensitive for transforming forces in a narrow range of directions into movement of the element. Therefore, at least a force having a direction that is aligned with at least one direction of sensitivity of the SiN arms may be transformed into a movement of the element by the SiN arms.

Figure 11:
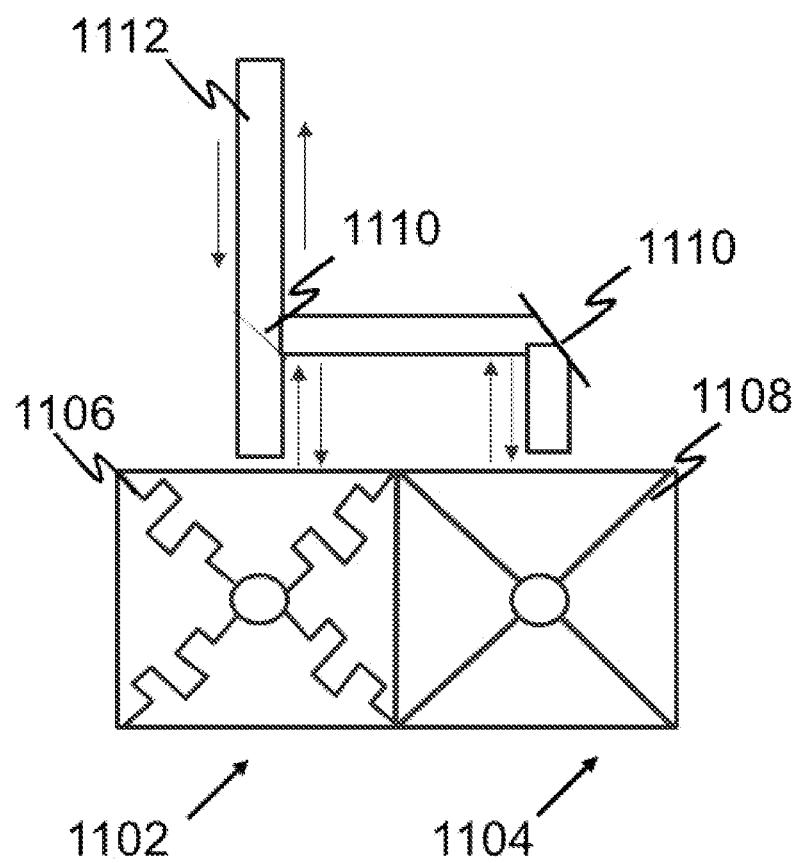
FIG. 11 illustrates an example of an arrangement comprising more than one MOMS sensor.

FIG. 11 illustrates an example of an arrangement comprising more than one MOMS sensor. The MOMS sensors 1102, 1104 may be configured sensitive to one or more parameters of one or more quantities comprising: acceleration, speed, displacement, force, pressure, acoustic wave and temperature.

Examples of the parameters comprise magnitudes of the quantities in different directions. The directions may be defined by axes of a coordinate system, for example x-, y-, and z-axes of a cartesian coordinate system. Accordingly, the MOMS sensors 1102, 1104 may be configured sensitive to acceleration, speed, displacement, force, pressure, acoustic wave and temperature in the directions of x-, y-, and z-axes.

According to the illustration, the arrangement may comprise MOMS sensor that have different shapes of SiN arms 1106, 1108 for suspending elements. In this way the arrangement may be sensitive to different parameters of a specific quantity and/or sensitive to different quantities. The sensitivity may be provided by shapes of the SiN arms of the MOMS sensors 1002, 1004.

Interrogation of the MOMS sensors 1102, 1104 may be performed by a single fiber 1112 or a bundle of fibers. A single fiber may be used to connect to more than one MOMS sensor, provided that optical beam splitters 1110 are connected to the single fiber. According to the illustrated example, the single fiber is connected to two MOMS sensors. The optical beam splitters may be configured, e.g. based on reflectivity ratio for X/Y operation, where X may be a transmission ratio and Y may be a reflection ratio, e.g. X=50% and Y=50%, wavelength or polarization. One or more beam splitters may be connected to the fiber for connecting the single fiber to the MOMS sensors. The use of a single fiber may be supported by wavelength multiplexing or time-division multiplexing. In wavelength multiplexing, wavelength based optical splitters are used and a wavelength may be dedicated for interrogating each MOMS sensor. A different light source may be used for each wavelength. A single light detector may discretize each of the wavelengths. On the other hand, an array of light detectors may be used for discretizing each of the wavelengths, where each light detector may have a narrow wavelength bandwidth (linked to the sources wavelengths).

In time-division multiplexing, a pulsed signal can be separated by the time taken to travel the different path lengths to the MOMS sensor.

Figure 12:
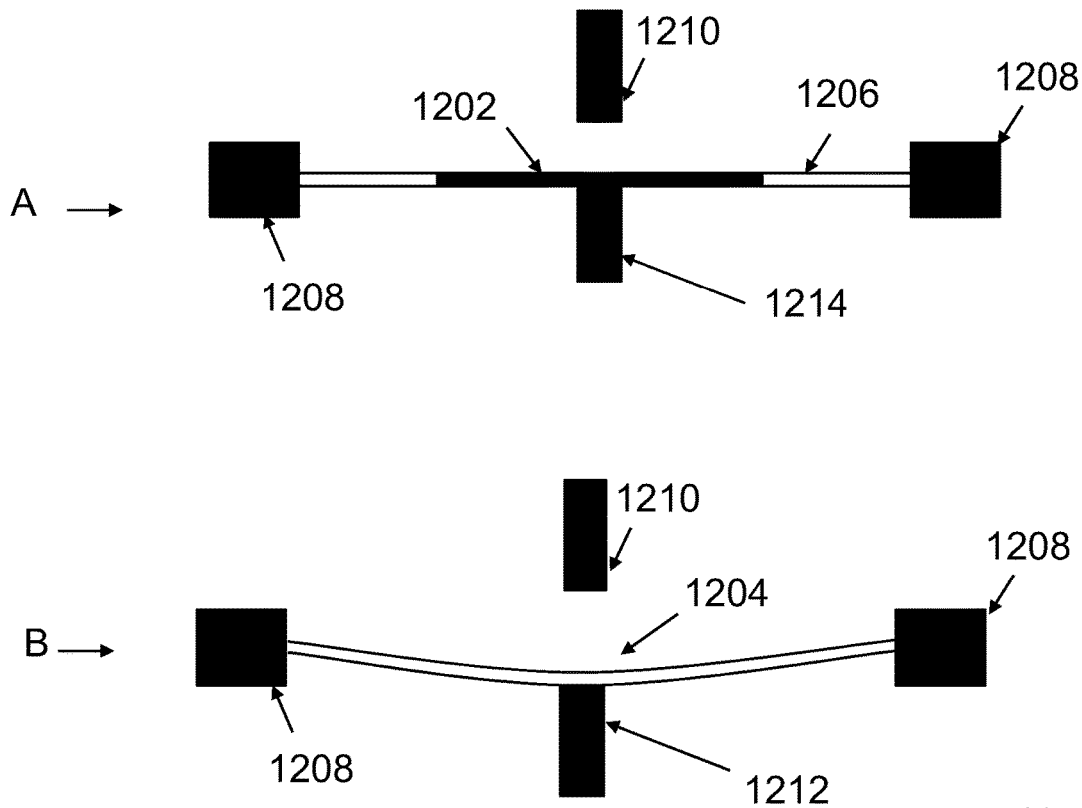
FIG. 12 illustrates an example of operation of elements in accordance with at least some embodiments of the present invention.

FIG. 12 illustrates an example of operation of elements in accordance with at least some embodiments of the present invention. The element 1202, 1204 is suspended by the SiN arms 1206 to the walls 1208 of the cavity, whereby light from at least one fiber 1210 may be communicated between a surface of the element and the fiber. When suspended within the cavity, the element 1202, 1204 may have a plurality of positions with respect to the fibers. The plurality of positions comprises at least positions, where the element is located at different distances with respect to the fiber tip. Examples of the positions may comprise a rest position 'A' and one or more displacement positions 'B', where the element is displaced from the rest position. Intensities of light transmitted from the fiber and reflected back from the surface of the element may be measured in different positions of the element. FIG. 12 illustrates two positions of the element 1202, 1204. At the rest position, the element 1202 has not been displaced by external forces acting on the element. In the displacement position, the element is displaced by at least one force acting on the element. In the illustrated example the force has caused a movement of the element 1204 away from the fiber tip.

In an example in accordance with at least some embodiments, an element may comprise a membrane. The membrane may comprise an extension part 1214 that serves as a mass, if needed. In this way the element may be made from a uniform material without necessarily any additional masses.

In an example in accordance with at least some embodiments, the element 1204 may comprise a transparent membrane or at least a semi-transparent membrane, and a mass 1212 is attached under the membrane. In this way, when the element is at a displacement position, the membrane may be configured to focus back the light from the mass 1212 attached to the membrane towards the fiber. Accordingly, the membrane may serve as a lens that is configured to focus light from the fiber to the surface of the mass 1212, when the element is at the rest position and/or when the element is at any desired displacement position. In case the light coming from the fiber towards the membrane is not focused but collimated or slightly focused or slightly diverging, then the membrane moving towards the bottom in the "B" state will act as a lens to focus the light back towards the fiber, in this way improving the signal-to-noise ratio. In an example the membrane may be of SiN. Transparency of the membrane may depend on the light source wavelength. For example, the SiN is more transparent at 850 nm wavelength than at 1500 nm.

Figure 13:
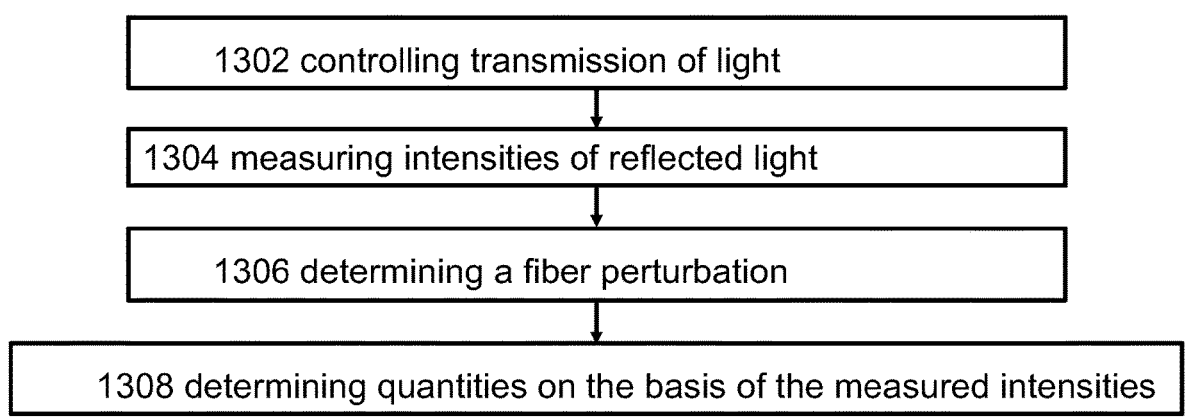
FIG. 13 illustrates an example of a method in accordance with at least some embodiments of the present invention.

FIG. 13 illustrates an example of a method in accordance with at least some embodiments of the present invention. The method may be performed by an arrangement comprising one or more MOMS sensors connected by one or more optical fibers to one or more light sources and one or more light detectors, one or more processors, and a memory comprising a computer code, which when executed by the processors causes one or more phases of the method.

Phase 1302 comprises controlling a transmission of light by the light sources to the fibers.

Phase 1304 comprises measuring intensities of reflected light received back by the light detectors from the MOMS sensors through the fibers.

Phase 1308 comprises determining one or more quantities on the basis of measured intensities.

In an example according to at least some embodiments of the present invention, at least one of at least two fibers connected to a MOMS sensor comprises a reflective surface arranged at the end of the fiber connected to the MOMS sensors and the arrangement is caused to perform phase 1306 comprising determining a fiber perturbation on the basis of a measured intensity of light reflected back from the reflective surface of the fiber. In this way the quantities may be determined in phase 1308 while taking into account the fiber perturbation. For example, if the light is sent to both of the fibers, and one of the fibers, a so-called reference fiber, has a reflective surface at its tip, and the second fiber is used for interrogating the element inside the MOMS sensor, then any variation on the fiber itself, impacting the light will be the same for both fibers. Then a processor may simply process the delta of the reference fiber with the measured fiber to extract the useful (uncorrupted sensor data information).

In an example, during phase 1308, an algorithm transforms the measured light intensities into displacement information and sensor characteristics.

In an example, phase 1308 comprises that at least one of the fibers has a large focal length for measuring a displacement of the element within a range and at least one of the fibers has a smaller focal length offset to measure the displacement of the element within a portion of the range. The large focal length provides coarse measurement over the range and if the displacement is determined based on the coarse measurement to be within the portion of the range, the fiber that is offset to measure the portion may be interrogated for obtaining an accurate measurement of the displacement within the portion of the range. More than one fiber having smaller focal lengths may be offset to measure displacement within different portions of the range, whereby the coarse measurement may be used to determine a portion of the range and the corresponding fiber to be interrogated to obtain an accurate measurement.

Figure 14:
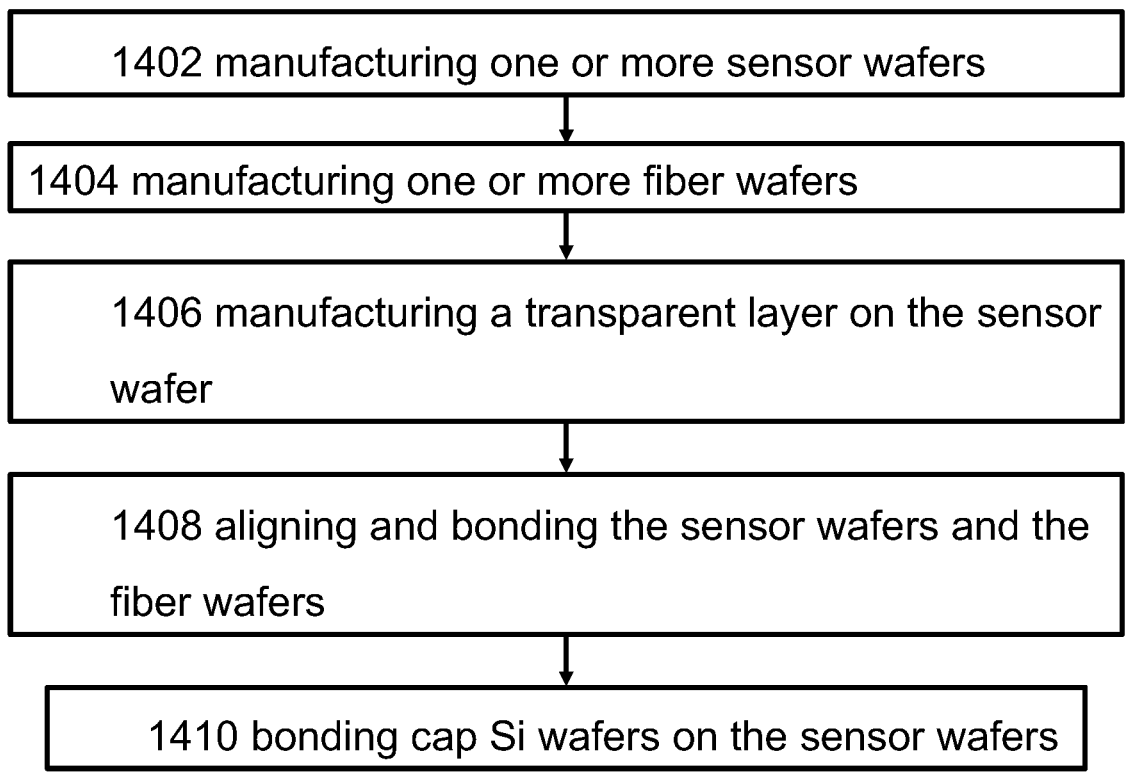
FIG. 14 illustrates an example manufacturing method for MOMS sensor in accordance with at least some embodiments of the present invention.

FIG. 14 illustrates an example manufacturing method for a MOMS sensor in accordance with at least some embodiments of the present invention. Accordingly, the MOMS sensor may be the MOMS sensor described with reference to FIGS. 1a and 1b or any of the embodiments described herein. The method comprises phase 1402 of manufacturing one or more sensor wafers. The one or more sensor wafers may be manufactured by depositing SiO2 and Si(x)N(y) onto an Si wafer;
patterning SiN arms into the Si(x)N(y) layer;
protecting the Si(x)N(y) with a protection layer, for example a layer of Alumina, resist or parylene, of at least 100 nm;
stripping the SiO2 and Si(x)N(y) layers from backside of the Si wafer;
patterning one or more Si masses and etching the masses from the Si wafer;
stripping SiO2 and the protection layer from topside of the Si wafer for releasing the masses and the SiN arms.

In an example, in phase 1402, depositing SiO2 and Si(x)N(y) onto an Si wafer comprises depositing first the Si(x)N(y) and after that the SiO2 in order to avoid lift-off of the nitride layer.

Phase 1404 comprises manufacturing one or more fiber wafers. The one or more fiber wafers may be manufactured by:

etching one or more cavities into an Si wafer;
protecting the cavities with a protection layer, for example a layer of Alumina, resist or parylene, of at least 100 nm;
etching fiber passthroughs through the Si wafer;
stripping the protection layer from the Si wafer;
coating parylene on the Si wafer for bonding with a sensor wafer.

Phase 1406 comprises manufacturing a transparent layer on the sensor wafer by a spin-on-glass process. A coefficient of thermal expansion of the glass is preferably matched with the coefficient of thermal expansion of the sensor wafer. In this way resiliency of the structure of the MOMS sensor may be provided against temperature changes in environment of the MOMS sensor, whereby the wafer stack will not break when heated and hermeticity of the cavity may be maintained. The transparent layer may be made of an amorphous substrate or a crystalline substrate.

In example in accordance with at least some embodiments, one or more lenses are arranged on the transparent layer. The lenses may be manufactured using an inkjet of polymer and/or post-baking photo-polymer directly on to the transparent, or attached to the transparent layer afterwards. On the other hand, the transparent layer and the lenses may be manufactured together from an amorphous or a crystalline substrate by etching the lenses by laser machining to the transparent layer of the amorphous or the crystalline substrate.

Phase 1408 comprises aligning and bonding the sensor wafers with the fiber wafers.

Phase 1410 comprises bonding one or more cap Si wafers on the sensor wafers for forming encapsulated cavities comprising the masses.

In an example in accordance with at least some embodiments, phase 1408 comprises bonding transparent layers between the sensor wafers and the fiber wafers.

In an example in accordance with at least some embodiments, phase 1408 comprises that the fiber wafers are aligned with the sensor wafers for communications of light between the masses and one or more fibers received through the fiber passthroughs.

In an example in accordance with at least some embodiments, the phases of the manufacturing method are performed in a controlled atmosphere comprising one or more gases that are encapsulated into the cavities. On the other hand the controlled atmosphere may be a vacuum. In this way the movable mass may be within a controlled environment, which supports sensitivity of the MOMS sensor.

In an example in accordance with at least some embodiments, the phase 1410 comprises depositing getters into the cavities for controlling atmosphere inside the cavities. In an example, the getters may be deposited on the cap Si wafers and the Si wafer is bonded on the senor wafers such that the getter is left inside the cavity.

In an example, phase 1402 comprises that the Si(x)N(y) layer has a thickness from 10 nm to 2 µm, preferably from 20 nm to 200 nm.

In an example a side length of the MOMS sensor manufactured by the method described in FIG. 14 may be 1 to 5 mm.

Figure 15:
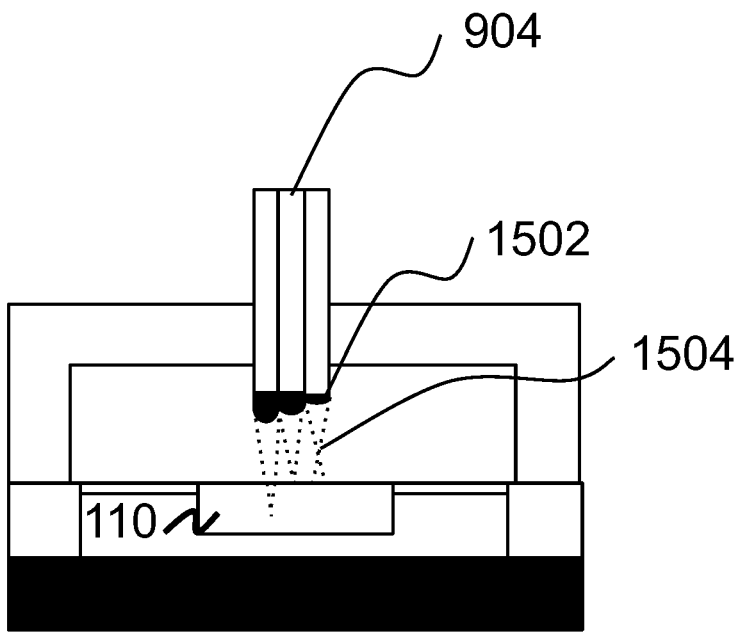
FIG. 15 illustrates an example of MOMS sensor for accurate measurement of displacement over a large dynamic range in accordance with at least some embodiments of the present invention.

FIG. 15 illustrates an example of MOMS sensor for accurate measurement of displacement over a large dynamic range in accordance with at least some embodiments. The MOMS sensor comprises a bundle of fibers 904 received in a fiber passthrough of the MOMS sensor similar to described with FIG. 9. The bundle of fibers comprises fibers with different focal lengths 1504. In an example at least one of the fibers 904 has a large focal length for measuring a displacement of the element 110 within a range and at least one of the fibers 904 has a smaller focal length that is offset to measure the displacement of the element within a portion of the range. The large focal length provides coarse measurement over the range and if the displacement is determined based on the coarse measurement to be within the portion of the range, the fiber of the bundle of fibers that is offset to measure the portion may be interrogated for obtaining an accurate measurement of the displacement within the portion of the range. More than one fiber having smaller focal lengths may be offset to measure displacement within different portions of the range, whereby the coarse measurement may be used to determine a portion of the range and the corresponding fiber to be interrogated to obtain an accurate measurement of the displacement.

In an example the fibers may have lenses 1502 arranged at tips of the fibers for configuring focal lengths of the fibers. In this way the focal lengths may be configured for measuring displacement of the element at smaller and larger ranges.

It should be appreciated that the fibers in a bundle of fibers 904 may have different cross sections, and the lenses 1502 at the fiber tips may have different focal lengths or numerical apertures. The different focal lengths provide that large displacements of the element may be measured at least by the fiber having the longest focal length. Then, smaller displacements of the element may be measured by another fiber that has a smaller but sufficient focal length for measuring the smaller displacements. In an example, one of the fibers may have a focal length for measuring displacement of the element over the whole range. The further fibers may have smaller focal lengths and that are offset toward different ends of the range such that smaller displacements may be measured.

A computer code may be computer readable program code means, a computer code, a computer program or computer instructions.

A memory may be a computer readable medium that may be non-transitory. The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general-purpose computers, special purpose computers, microprocessors, and processors based on multi-core processor architecture, as non-limiting examples.

Furthermore, although processing phases or method phases, etc. have been described in a given order, such processing or methods may be configured to operate in a different order. In other words, any order or sequence of phases described in this patent application essentially does not indicate a requirement that the phases be performed in that order. The described phases may actually be executed in any order. Furthermore, some phases even if they may not be described as being performed simultaneously (e.g., one phase may be described to take place after another phase), they may in fact be performed simultaneously. Moreover, the processes shown in the drawings do not indicate that the illustrated processes exclude other modifications and variations, and do not indicate that any of the illustrated processes or phases thereof are necessary for one or more inventions.

It will be obvious to one skilled in the art that in the development of technology the basic idea of the invention can be implemented in many different ways. Thus, the invention and its embodiments are not restricted to the examples described above but can vary within the scope of the claims.

The invention claimed is:

1. A micro-opto-mechanical system (MOMS) sensor comprising:
   a fiber interface comprising a fiber passthrough for one or more optical fibers; and
   a cavity comprising an element hermetically encapsulated within the cavity, wherein said element is movably anchored by SiN arms to walls of the cavity, wherein the SiN arms comprise anchor portions at first ends of the SiN arms connected to the element and at second ends of the SiN arms connected to the walls of the cavity,
   wherein the fiber interface is configured to receive the fibers through the fiber passthrough into positions for communications of light between the element and the fibers.

2. The MOMS sensor according to claim 1, wherein the fiber interface is separated from the cavity by a transparent layer for communications of light between the element and the fibers received through the fiber passthrough.

3. The MOMS sensor according to claim 2, wherein the transparent layer comprises one or more lenses arranged on a cavity facing side of the transparent layer.

4. The MOMS sensor according to claim 1, comprising one or more lenses arranged at ends of the optical fibers received within the fiber passthrough.

5. The MOMS sensor according to claim 1, wherein the fiber interface comprises one or more reflective surfaces for aligning light beams of the fibers received through the fiber passthrough for communications of light between the element and the fibers.

6. The MOMS sensor according to claim 1, wherein the SiN arms are configured sensitive to forces in one or more directions of movement.

7. The MOMS sensor according to claim 1, comprising a hermetically encapsulating ceramic outer shell.

8. An arrangement comprising:
   one or more MOMS sensors according to claim 1 connected by one or more optical fibers to one or more light sources and one or more light detectors; and
   one or more processors, a memory comprising a computer code, which when executed by the processors causes the arrangement to:
   control a transmission of light by the light sources to the fibers;
   measure intensities of reflected light received back by the light detectors from the MOMS sensors through the fibers;
   determine one or more quantities on the basis of measured intensities.

9. The arrangement according to claim 8, wherein a reflective surface is arranged at an end of at least one fiber connected to a MOMS sensor or a reflective surface is arranged on a transparent layer between said element and at least one fiber, or reflective surfaces are arranged both at an end of at least one fiber and a reflective surface is arranged on a transparent layer between said element and at least one fiber, and the arrangement is caused to:

determine a fiber perturbation on the basis of a measured intensity of light reflected back from the reflective surface of the fiber and/or of the transparent layer.

10. The arrangement according to claim 8, comprising a ceramic outer shell for hermetically encapsulating the MOMS sensors.

11. The arrangement according to claim 8, wherein at least one of the fibers has a large focal length for measuring a displacement of the element within a range and at least one of the fibers has a smaller focal length offset to measure the displacement of the element within a portion of the range.

12. A method for manufacturing one or more MOMS sensors, comprising:
  manufacturing one or more sensor wafers, comprising:
    depositing an SiO2 and an Si(x)N(y) layer onto a first Si wafer;
    patterning SiN arms into the Si(x)N(y) layer;
    protecting the Si(x)N(y) layer with a first protection layer of at least 100 nm;
    stripping the SiO2 and Si(x)N(y) layers from a first side of the first Si wafer;
    patterning Si masses and etching the patterned Si masses from the first Si wafer;
    stripping the SiO2 layer and the first protection layer from a second, opposing side of the first Si wafer for releasing the etched masses and the patterned SiN arms; and
  manufacturing one or more fiber wafers, comprising:
    etching one or more cavities into a second Si wafer;
    protecting the etched cavities with a second protection layer of at least 100 nm;
    etching fiber passthroughs through the second Si wafer;
    stripping the second protection layer from the second Si wafer;
    coating parylene on the second Si wafer for bonding with a sensor wafer; and
  aligning and bonding the sensor wafers and the fiber wafers; and
  bonding cap Si wafers on the sensor wafers for forming encapsulated cavities comprising the etched Si masses.

13. The method according to claim 12, comprising:
  bonding transparent layers between the sensor wafers and the fiber wafers.

* * * * *